(12) United States Patent
Gerhardt et al.

(10) Patent No.: US 8,614,134 B2
(45) Date of Patent: Dec. 24, 2013

(54) SHALLOW SOURCE AND DRAIN ARCHITECTURE IN AN ACTIVE REGION OF A SEMICONDUCTOR DEVICE HAVING A PRONOUNCED SURFACE TOPOGRAPHY BY TILTED IMPLANTATION

(75) Inventors: Martin Gerhardt, Dresden (DE); Peter Javorka, Radeburg (DE); Juergen Faul, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 211 days.

(21) Appl. No.: 13/052,583

(22) Filed: Mar. 21, 2011

(65) Prior Publication Data

US 2012/0241864 A1 Sep. 27, 2012

(51) Int. Cl.
*H01L 21/336* (2006.01)

(52) U.S. Cl.
USPC ........... 438/302; 438/299; 438/300; 438/301; 257/E21.409

(58) Field of Classification Search
USPC .......... 438/299–302, 576; 257/192, 288, 368, 257/E21.409, E29.021
See application file for complete search history.

(56) References Cited

U.S. PATENT DOCUMENTS

| | | | | |
|---|---|---|---|---|
| 5,177,027 | A * | 1/1993 | Lowrey et al. | 438/270 |
| 6,580,137 | B2 * | 6/2003 | Parke | 257/401 |
| 6,881,635 | B1 * | 4/2005 | Chidambarrao et al. | 438/300 |
| 7,358,149 | B2 * | 4/2008 | Wang et al. | 438/433 |
| 7,482,615 | B2 * | 1/2009 | Zhu | 257/1 |
| 7,531,423 | B2 * | 5/2009 | Cheng et al. | 438/409 |
| 7,888,201 | B2 * | 2/2011 | Yeo et al. | 438/238 |
| 8,049,251 | B2 * | 11/2011 | Shima | 257/192 |
| 2005/0242340 | A1 * | 11/2005 | Chidambarrao et al. | 257/19 |
| 2005/0282342 | A1 * | 12/2005 | Adan | 438/294 |
| 2006/0286757 | A1 * | 12/2006 | Power et al. | 438/305 |
| 2007/0049022 | A1 * | 3/2007 | Chen et al. | 438/682 |
| 2008/0003730 | A1 * | 1/2008 | Okuno | 438/156 |
| 2008/0318385 | A1 * | 12/2008 | Kavalieros et al. | 438/285 |
| 2009/0170268 | A1 * | 7/2009 | Teo et al. | 438/285 |
| 2010/0289093 | A1 * | 11/2010 | Yang et al. | 257/408 |
| 2010/0327361 | A1 * | 12/2010 | Benaissa et al. | 257/368 |
| 2011/0006344 | A1 * | 1/2011 | Murthy et al. | 257/190 |
| 2011/0101418 | A1 * | 5/2011 | Murthy et al. | 257/190 |
| 2011/0147842 | A1 * | 6/2011 | Cappellani et al. | 257/365 |
| 2011/0163379 | A1 * | 7/2011 | Sleight et al. | 257/347 |
| 2012/0100674 | A1 * | 4/2012 | Anderson et al. | 438/157 |
| 2012/0161238 | A1 * | 6/2012 | Scheiper et al. | 257/368 |

* cited by examiner

*Primary Examiner* — Jarrett Stark (74) *Attorney, Agent, or Firm* — Williams, Morgan & Amerson, P.C.

(57) ABSTRACT

In sophisticated semiconductor devices, a shallow drain and source concentration profile may be obtained for active regions having a pronounced surface topography by performing tilted implantation steps upon incorporating the drain and source dopant species. In this manner, a metal silicide may be reliably embedded in the drain and source regions.

20 Claims, 11 Drawing Sheets

SHALLOW SOURCE AND DRAIN ARCHITECTURE IN AN ACTIVE REGION OF A SEMICONDUCTOR DEVICE HAVING A PRONOUNCED SURFACE TOPOGRAPHY BY TILTED IMPLANTATION

BACKGROUND OF THE INVENTION

1. Field of the Invention

The present disclosure relates to the field of semiconductor manufacturing, and, more particularly, to contact areas of transistors having a shallow drain and source dopant profile.

2. Description of the Related Art

Semiconductor devices, such as advanced integrated circuits, typically contain a large number of circuit elements, such as transistors, capacitors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are also referred to as metallization layers. These metallization layers generally include metal-containing lines, providing the inner-level electrical connection, and also include a plurality inter-level connections, which are also referred to as "vias," that are filled with an appropriate metal and provide the electrical connection between two neighboring stacked metallization layers.

To establish the connection of the circuit elements to the metallization layers, an appropriate contact structure is provided that connects to a respective contact region of a circuit element, such as a gate electrode and the drain/source regions of field effect transistors, and to a respective metal line in the first metallization layer. The vertical contact structure, including a plurality of contacts or contact plugs, is formed in an inter-layer dielectric material that encloses and passivates the circuit elements.

The continuing shrinkage of dimensions of circuit elements, such as transistors, has been and will be remaining a major goal of semiconductor manufacturers, since significant gain in performance of semiconductor devices may be accomplished in terms of operating speed, production costs and the like. For example, the gate length of field effect transistors has now reached 0.05 μm and less and, hence, fast and powerful logic circuitry, such as microprocessors, storage devices and the like may be formed on the basis of these transistors, due to increased packing density, thereby also providing the possibility of incorporating more and more functions into a single die region. For instance, the amount of storage incorporated into modern CPUs has steadily increased, thereby enhancing overall performance of microprocessors. In other cases, complex analog and digital circuitry may be provided on the same semiconductor chip, thereby offering enhanced control functionality for a plurality of electronic devices. Upon reducing the feature sizes of the semiconductor circuit elements in the device level, however, the dimensions of the metal lines and vias in the wiring level of the semiconductor devices also have to be reduced, since the contact areas of the circuit elements have to be connected to the metallization level so that at least the contact structure and lower lying metallization levels may also require a significant reduction in size of the individual metal lines and vias.

It should be appreciated that, for highly scaled semiconductor devices, typically, electrical performance of the metallization system including the contact level has a significant influence on the overall performance of the semiconductor device due to parasitic capacitance and the parasitic resistivity of the metal features. Consequently, in modern semiconductor devices, frequently, highly conductive metals, such as copper and the like, may be used in combination with dielectric materials of reduced permittivity in order to restrict signal provocation delay caused by the metallization system. On the other hand, in the device level, a reduction of the channel length of field effect transistors in combination with very high dopant concentrations in the drain and source regions and gate electrodes, which may be comprised of polysilicon, may be used in view of reducing the overall series resistance of the individual circuit elements. However, in order to further reduce the series resistance of transistor devices and other circuit elements in the device level, the resistivity of highly doped silicon based semiconductor areas is typically reduced by incorporating an appropriate metal species, for instance in the form of a metal silicide. The corresponding metal silicide may have a reduced sheet resistivity compared to even highly doped semiconductor materials, and hence a respective manufacturing sequence is typically incorporated in sophisticated process techniques in order to form appropriate metal silicide regions in the drain and source areas or other contact areas of circuit elements, possibly in combination with providing a respective metal silicide in the polysilicon gate electrodes.

Recently, well-approved metal silicides in the form of cobalt di-silicide are increasingly being replaced by metal silicide components of enhanced conductivity, such as nickel silicide. Although significant performance advantages may be associated with the incorporation of a nickel silicide into the drain and source areas of the transistors, it turns out, however, that, in the manufacturing sequence for forming metal silicides, significant yield loss may be observed in view of device failures, which may frequently be caused by short circuits "shorting" the PN junctions of the transistors in the drain and source areas.

These device failures are frequently associated with a pronounced surface topography of the active semiconductor regions, which in turn may be caused by a complex manufacturing sequence for forming sophisticated transistor devices. For example, significant gain in performance may be accomplished by inducing certain strain conditions in the active regions of the transistors since a strained silicon material may have significantly altered electronic characteristics, in particular with respect to charge carrier mobility, which may be taken advantage of with respect to increasing overall conductivity and thus switching speed of the transistors. To this end, appropriate semiconductor alloys, such as silicon/germanium, silicon/carbon and the like, are frequently incorporated into a portion of the active regions by selective epitaxial growth techniques in order to obtain a strained state of the grown semiconductor alloy due to a mismatch of the natural lattice constants of these materials with respect to the lattice constant of the silicon base material.

In other sophisticated approaches, the electronic characteristics of at least a portion of the active region may be adjusted, for instance in terms of adjusting the threshold voltage of the transistors by incorporating an appropriate semiconductor alloy, such as a silicon/germanium alloy, which may thus result in a modification of the band gap energy at the vicinity of an interface formed by a gate dielectric material and the active region. For example, in sophisticated approaches, gate electrode structures of field effect transistors may be provided on the basis of a high-k dielectric material in combination with a metal-containing electrode material, which may require appropriate adaptations of the electronic characteristics of the active region, at least in the vicinity of the gate dielectric material for at least some transistor devices. Also in this case, sophisticated selective epitaxial growth techniques are usually applied, which may also result in a modified surface topography, which may result in significant irregularities upon forming the metal silicide regions, as will also be explained in more detail with reference to FIGS. 1a-1f.

Figure 1A:
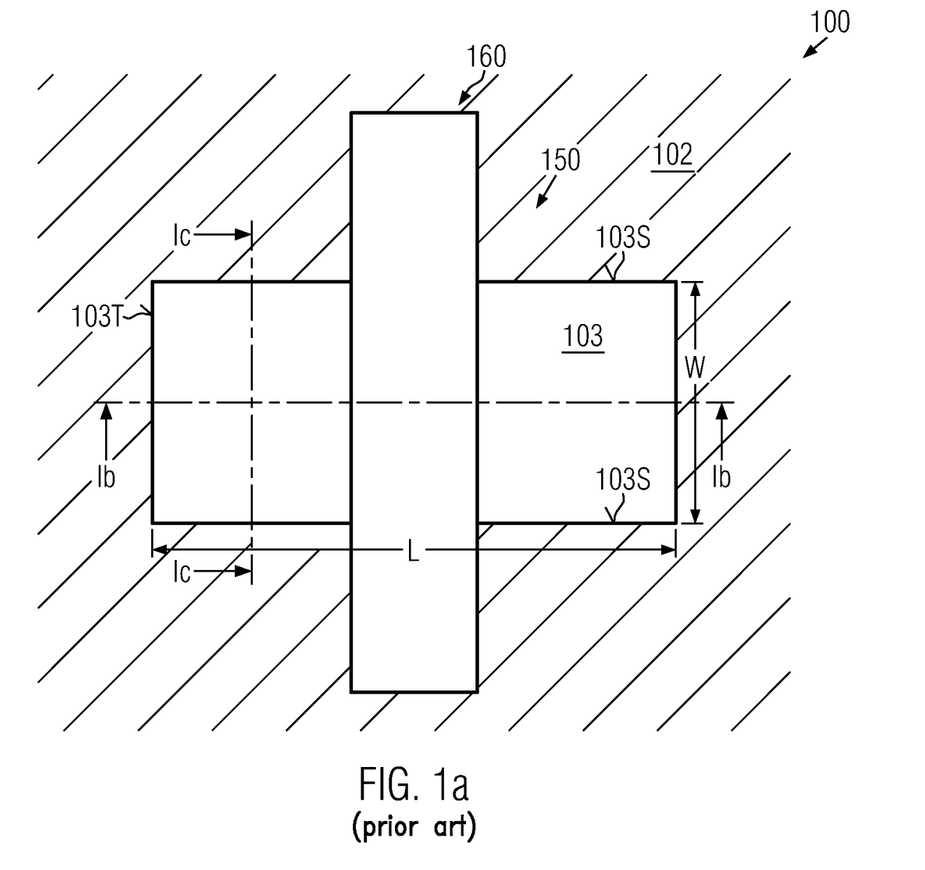
FIG. 1a schematically illustrates a top view of a semiconductor device formed according to conventional process strategies.

FIG. 1a schematically illustrates a top view of a semiconductor device 100 in which a transistor 150, i.e., a field effect transistor, is provided, for instance in the form of an N-channel transistor or a P-channel transistor. As illustrated, the transistor 150 comprises a semiconductor region 103, which is also referred to herein as an active region indicating that at least one transistor is to be formed in and above the corresponding semiconductor region. The active region 103 is typically formed from a silicon-based semiconductor layer which is appropriate laterally delineated into a plurality of active regions by means of an isolation region 102, such as a shallow trench isolation region comprised of silicon dioxide, silicon nitride and the like. Furthermore, a gate electrode structure 160 is formed on the active region 103 and extends also into the isolation region 102 as may be required for connecting to other transistors and/or for allowing the reliable contacting of the gate electrode structure 160 by appropriate contact elements, as is also discussed above. As indicated above, the isolation region 102 may laterally delineate the active region 103, thereby defining respective sidewalls 103S, which thus represent the boundaries of the active region 103 in a width direction, indicated as W. Similarly, in a length direction L, sidewalls 103T represent the boundaries of the active region 103, which, in the illustrative embodiment, may be have a substantially rectangular shape.

Figure 1B:
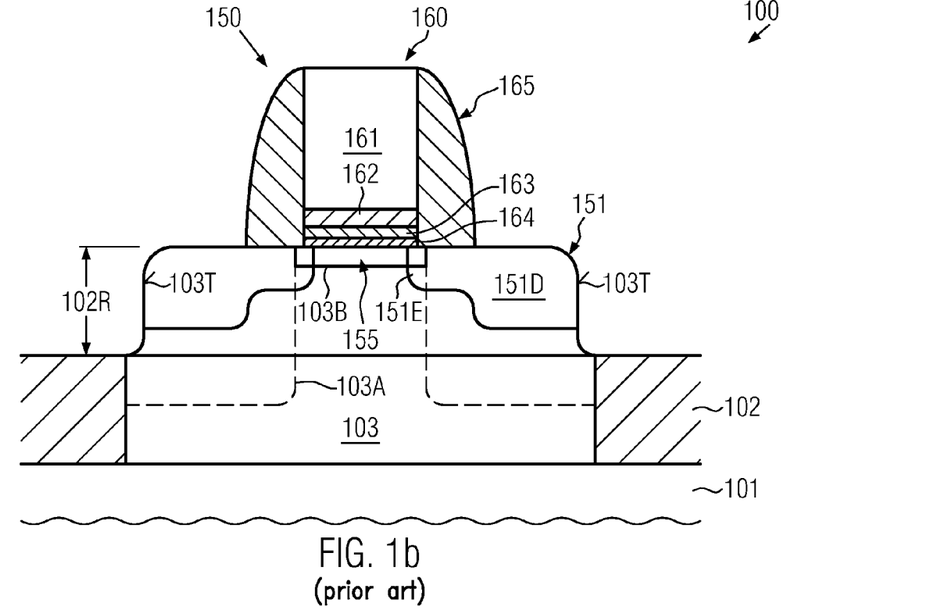

FIG. 1b schematically illustrates a cross-sectional view taken along the line Ib of FIG. 1a. As illustrated, the isolation region 102 may be significantly recessed, as indicated by 102R, with respect to the active region 103. The degree of recessing 102R may significantly depend on the process history of the transistor 150, wherein, in sophisticated applications, the corresponding sidewalls 103T may be represented by rather steep sidewalls, which may have a significant influence on the finally obtained dopant profile of drain and source regions 151. Moreover, in the manufacturing stage shown, the gate electrode structure 160 is formed on the active region 103 and comprises a sidewall spacer structure 165, which is typically used as an implantation mask when adjusting the concentration profile of the drain and source regions 151 and which may also be used in the subsequent processing, at least partially, as a mask for forming metal silicide regions in the active region 103. Furthermore, the gate electrode structure 160 comprises an electrode material 161, such as a polysilicon material and the like, possibly in combination with a metal-containing electrode material 162, such as titanium nitride and the like. Furthermore, a gate dielectric layer 164, possibly in combination with a high-k dielectric material 163, may be provided in sophisticated applications. Furthermore, as shown, a strain-inducing semiconductor alloy 103A, for instance in the form of a silicon/germanium alloy and the like, may be provided so as to induce certain strain conditions in order to improve overall transistor performance. For example, incorporating a silicon/germanium alloy as the material 103A, a compressive strain is induced, which in turn may result in superior conductivity of holes, thereby improving the performance of P-channel transistors. Furthermore, a semiconductor alloy 103B, such as a silicon/germanium alloy, may be provided as a part of the active region 103 in order to adjust the threshold voltage of the transistor 150 in combination with the gate electrode structure 160, which may have incorporated therein a high-k dielectric material and the electrode material 162.

Figure 1C:
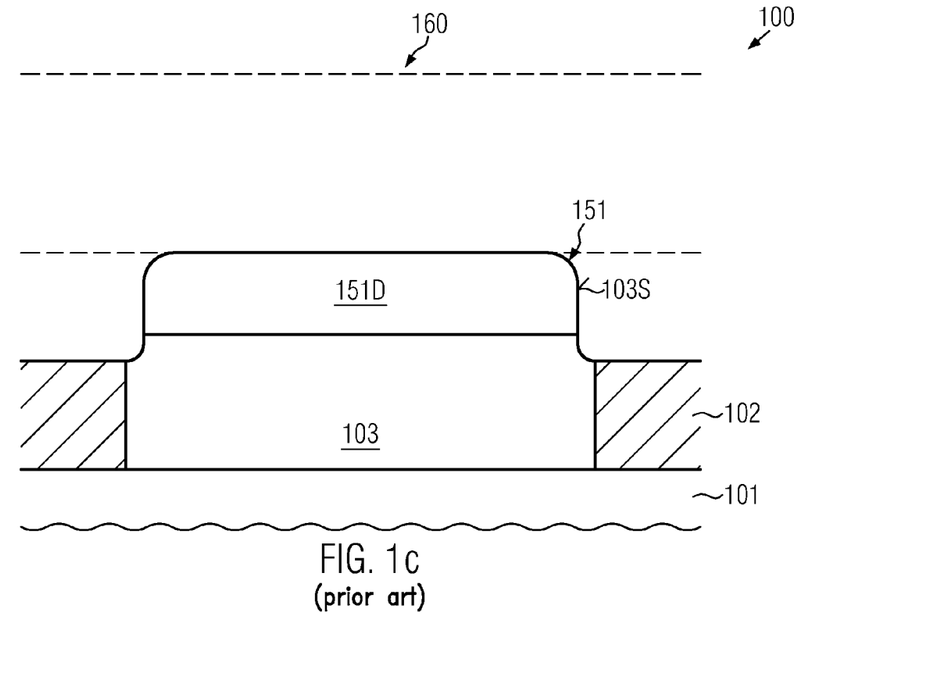

FIG. 1c schematically illustrates a cross-sectional view of the device 100 along the line Ic of FIG. 1a. As shown, also in this case the sidewalls 103S, i.e., the sidewalls delineating the active region 103 in the length direction (see FIG. 1a), may have a rather steep configuration. Moreover, as shown, the drain and source regions 151 may extend to a certain depth within the active region 103, depending on the implantation parameters used for incorporating the drain and source dopant species, as will be described later on in more detail.

It should be appreciated that, for convenience, the gate electrode structure 160, which would actually not be visible in this section, is indicated in dashed lines.

The semiconductor device 100 as shown in FIGS. 1a-1c may be formed on the basis of the following process strategies. The size, position and shape of the active region 103 is determined by forming the isolation region 102, which may be accomplished by applying well-established lithography, etch, deposition and planarization techniques in which appropriate trenches are formed in a semiconductor layer 101 (FIG. 1b), thereby obtaining a plurality of active regions such as the region 103. Prior to or after forming the isolation region 102, the basic dopant concentration in the various active regions 103 may be established by, for instance, ion implantation in combination with an appropriate masking regime so as to provide the active regions for P-channel transistors and N-channel transistors, possibly with different threshold voltage values, as required by the overall design rules. Thereafter, appropriate materials are deposited or formed by oxidation and are appropriately patterned on the basis of highly complex lithography techniques and etch processes in order to form the gate electrode materials 161, 162 and the dielectric materials 163, 164. A corresponding process sequence may comprise a plurality of complex patterning processes in order to incorporate appropriate work function metal species for the corresponding transistor type under consideration.

Furthermore, as discussed above, if the semiconductor layer 103B is to be provided, for instance when requiring a corresponding adaptation of the electronic characteristics, for instance when providing sophisticated gate materials, the complex gate patterning process is preceded by a process sequence in which an appropriate semiconductor alloy is grown selectively on active regions, which require a corresponding adaptation of the electronic characteristics. During the corresponding process sequence, hard mask materials have to be provided and patterned, followed by cleaning processes and the selective epitaxial growth process, wherein this sequence may generally result in a more or less pronounced material loss in the isolation regions 102, for instance caused by patterning the hard mask materials, performing cleaning processes and removing the hard mask materials. After patterning the gate electrode materials 161, 162, the processing may be continued by forming cavities in the active region 103 in order to incorporate the semiconductor material 103A, if required, wherein a complex process sequence is to be applied, i.e., the etching of the active region 103, while masking any other active regions, performing any cleaning processes and finally depositing the material 103A, followed by the removal of any hard mask materials, which may also result in a significant material erosion in the isolation regions 102. Thereafter, if required, implantation processes are typically applied for forming a portion of the drain and source regions 151.

Generally, it is to be noted that, upon reducing the overall transistor dimensions and in particular the gate length, i.e., in FIG. 1b, the horizontal extension of the electrode materials 161, 162, an appropriate adaptation of the drain and source concentration profiles has to be applied in order to preserve the desired transistor characteristics, such as channel controllability, leakage currents and the like. On the other hand, in view of reducing the overall series resistance in the transistors, a relatively high dopant concentration is to be provided in the drain and source regions 151. Frequently, in the vicinity of a channel area 155, the depth of the concentration profile is to be selected less compared to the depth of the concentration profile of "deep" drain and source regions 151D. To this end, typically, any drain and source extension regions 151E may be formed, for instance by providing an appropriate offset spacer element (not shown) and incorporating drain and source dopant species with an appropriate implantation energy and dose. Thereafter, the spacer structure 165 may be formed and further implantation processes are typically applied so as to incorporate further drain and source dopant species in order to form the regions 151D that appropriately connect to the extension regions 151E. Also, for the regions 151D, however, typically the depth of the concentration profile is to be reduced upon further shrinking the overall transistor dimensions. Thus, the depth of the areas 151D may be comparable or even less than the degree of recessing 102R. Moreover, since the drain and source regions 151 have to be provided with a shallow concentration profile, advanced anneal techniques are typically applied in which the overall dopant diffusion is reduced so as to not unduly "blur" the desired shallow drain and source architecture. To this end, laser-based or flashlight-based anneal techniques may be applied.

Figure 1D:
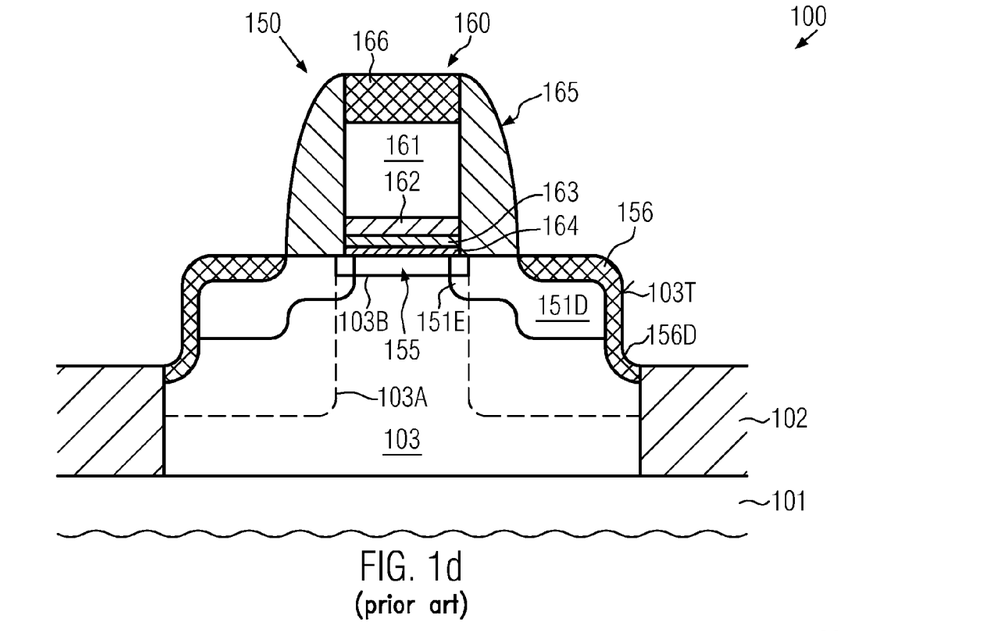
FIGS. 1d-1f schematically illustrate cross-sectional views and a top view, respectively, of the semiconductor device in a further advanced manufacturing stage in which metal silicide regions are formed in shallow drain and source regions on the basis of conventional process strategies.

FIG. 1d schematically illustrates the device 100 in a further advanced manufacturing stage. As shown, a metal silicide 166 is formed in the gate electrode structure 160 and also a metal silicide 156 is formed in the active region 103. As discussed above, typically, the metal silicide regions 156 are provided so as to reduce the overall contact resistivity between contact elements (not shown) to be formed in a later manufacturing stage, which in turn connect the transistor 150 to a metallization system still to be formed. In highly scaled semiconductor devices, the contribution of the contact resistivity with respect to the overall device performance is increasingly gaining in importance so that sophisticated materials are typically provided in the active region 103 in view of superior device performance. For example, nickel, possibly in combination with a certain amount of platinum, is frequently used in order to form nickel silicide. It turns out, however, that nickel silicide forms a Schottky barrier with a semiconductor material, wherein the height of the barrier may be significantly reduced when increasing the dopant concentration of the adjacent semiconductor material. Thus, in view of providing a maximum surface area of the metal silicide 156 that is available for charge carrier exchange with the drain and source regions 151, any interfaces of the material 156 and a semiconductor material are positioned within the highly doped drain and source regions 151. Moreover, if a high barrier exists between a moderately doped semiconductor material and the nickel silicide 156, extension of the metal silicide 156 into the remaining active region 103, i.e., "shorting" the corresponding PN junctions, may also be disadvantageous due to significantly increased leakage currents and other parasitic effects, while even a short circuit may be induced for operating voltages that are comparable to the Schottky barrier. As shown, during the silicidation process, typically an appropriate refractory metal is deposited and is subsequently heat treated so as to initiate silicon and metal diffusion. On the other hand, chemical reaction is substantially suppressed on any dielectric surface areas. Consequently, the spacer structure 165 and the isolation region 102 may act as efficient silicidation masks, while, on the other hand, the sidewalls 103T are efficiently silicided, thereby forming the metal silicide 156 which may thus be positioned outside of the deep drain and source areas 151D.

Figure 1E:
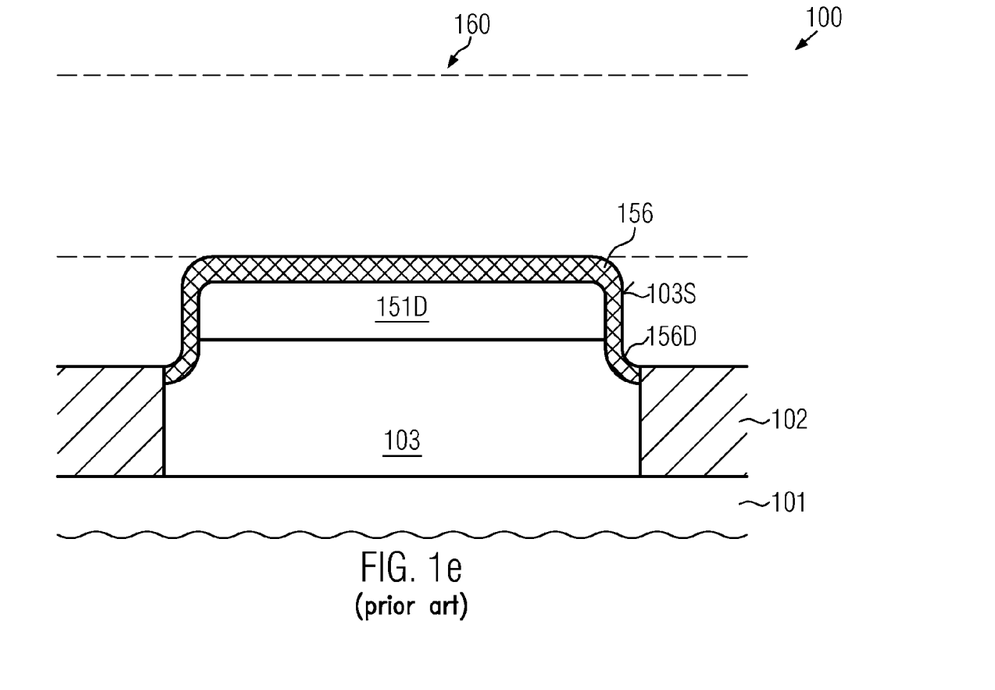

FIG. 1e schematically illustrates the situation in the cross-sectional view as indicated in FIG. 1a as section Ic, wherein also at the sidewalls 103S, the metal silicide 156D extends more deeply into the active region 103 compared to the deep drain and source areas 151D.

Figure 1F:
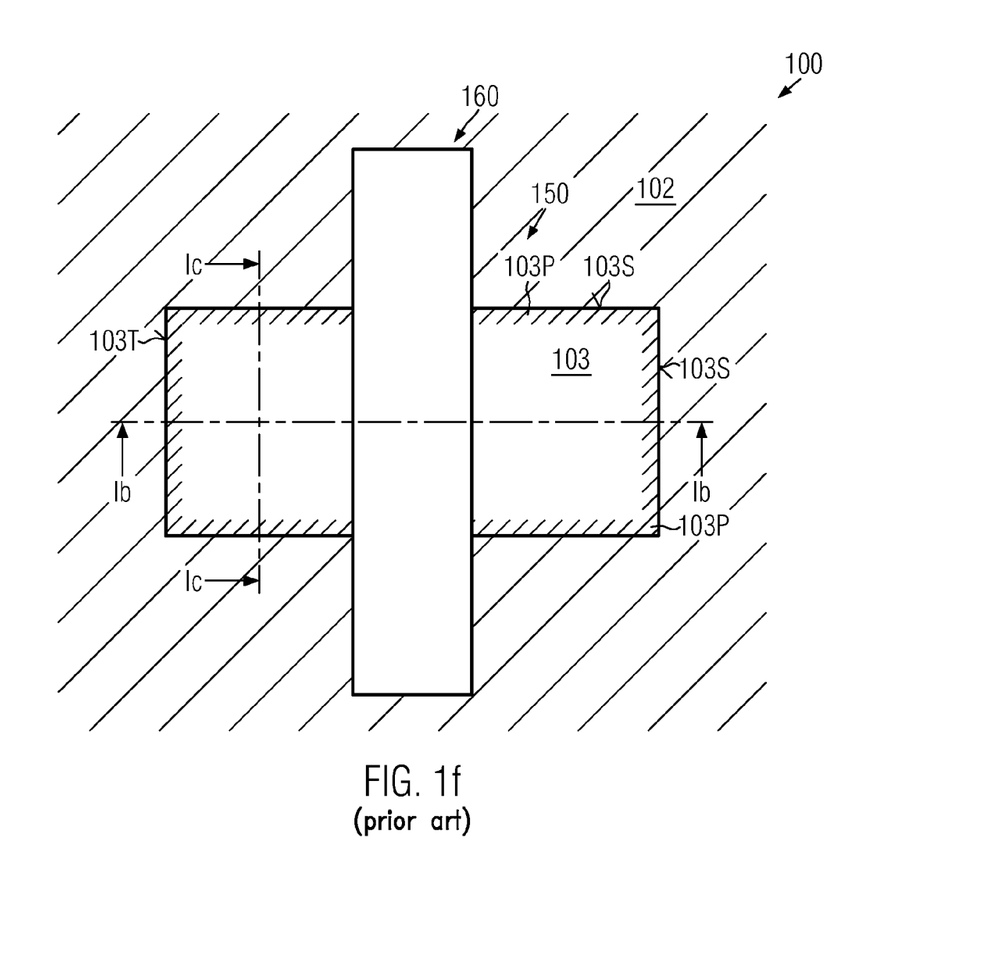

FIG. 1f schematically illustrates a top view of the device 100 in which the peripheral areas 103P at or in the vicinity of the sidewalls 103T, 103S are illustrated, in which the metal silicide may extend deeply into the active region 103, thereby possibly causing significant device failures or generally reducing overall performance of the transistor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which the probability of creating device failures upon forming contact regions, such as metal silicide regions, in sophisticated semiconductor devices is reduced by appropriately adapting the shallow dopant profile to the pronounced surface topography of the active regions. To this end, drain and source dopant species may be incorporated through at least some exposed sidewall areas of the active regions of pronounced surface topography so that, upon performing a silicidation process, the resulting metal silicide may be reliably embedded in highly doped semiconductor material, however, without unduly increasing the effective depth of the drain and source dopant concentration profile. The incorporation of the drain and source dopant species or at least a portion thereof may be accomplished by applying at least a tilted implantation step based on tilt angles in which the incorporation of the dopant species through the exposed sidewall surface areas may be accomplished. In some illustrative embodiments disclosed herein, the tilted implantation is performed so as to incorporate the dopant species, at least in sidewall areas, which delineate the active regions in the width direction for a planar transistor architecture, while sidewalls in a length direction may be appropriately covered by electrode lines or dummy electrode structures. In other cases, tilted implantation steps may be applied so as to incorporate drain and source dopant species from any exposed sidewall surface areas, thereby providing superior flexibility with respect to the transistor architecture and/or the arrangement of the individual transistor elements in the die region. For example, the principles disclosed herein may also be efficiently applied to non-planar transistor architectures in which generally the active region may be provided as a region of significant surface topography, for instance in the form of a semiconductor fin, for instance when considering multiple channel transistors or FinFETs and the like.

One illustrative method disclosed herein comprises performing an implantation process in the presence of a gate electrode structure so as to introduce drain and source dopant species through sidewalls and a top surface of a silicon-containing active region of a semiconductor device, wherein the active region is laterally enclosed by an isolation region that is recessed with respect to the active region. The method further comprises selectively forming a metal silicide on exposed portions of the silicon-containing active region.

A further illustrative method disclosed herein comprises forming a gate electrode structure on an active region of a semiconductor device, wherein the active region has a length and a width and is laterally delineated with respect to the length and/or the width by an isolation region that is recessed with respect to the active region so as to expose a sidewall area of the active region. The method further comprises forming drain and source regions in the active region by performing at least one tilted implantation step so as to introduce a portion of drain and source dopants through the sidewall area. Furthermore, a metal silicide is formed in a portion of the active region.

One illustrative semiconductor device disclosed herein comprises an isolation region formed above a substrate. Furthermore, a silicon-containing semiconductor region is laterally enclosed by the isolation region which is recessed with respect to the silicon-containing semiconductor region. The silicon-containing semiconductor region has a length that is delimited by a pair of first sidewalls and has a width that is delimited by a pair of second sidewalls. The semiconductor device further comprises a gate electrode structure formed on the silicon-containing semiconductor region. Moreover, drain and source regions having a dopant concentration profile are provided, wherein the dopant concentration profile is deeper at a periphery at the first sidewalls compared to a central area of the drain and source regions. Moreover, the semiconductor device comprises a metal silicide formed on a portion of the silicon-containing semiconductor region, wherein the metal silicide is positioned within the drain and source regions.

BRIEF DESCRIPTION OF THE DRAWINGS

The disclosure may be understood by reference to the following description taken in conjunction with the accompanying drawings, in which like reference numerals identify like elements, and in which:

FIGS. 1b-1c schematically illustrate cross-sectional views of the semiconductor device as shown in FIG. 1a;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which the dopant concentration profile is appropriately adapted to the surface topography of an active region by using tilted implantation steps upon incorporating the drain and source dopant species for the "deep" drain and source areas. In this manner, an appropriate "thickness" of the drain and source regions may be obtained with respect to any exposed sidewall surface areas of active regions of pronounced surface topography so that, upon performing a silicidation process, the resulting silicide material may efficiently penetrate the highly doped drain and source areas, however, without "shorting" the PN junction. In this manner, the entire interface formed by the metal silicide is available for the charge carrier transport, thereby reducing the overall series resistance, while at the same time any device failures caused by metal silicide protrusions crossing the PN junctions may be avoided or at least reduced.

In some illustrative embodiments, the tilted implantation process may be applied in a length direction or a width direction only in device configurations in which the other lateral dimensions of the active regions is delimited by sidewalls which are not exposed. For example, in many sophisticated manufacturing strategies, appropriately positioned dummy electrodes or generally electrode lines are positioned above the boundary of the active region, for instance the boundary in the length direction of planar transistor configurations. In this case, only sidewall areas delimiting the width of the active regions may be exposed and may be used as entry points for a tilted implantation process in order to obtain the desired adaptation of the drain and source dopant profile. In other illustrative embodiments, a tilted implantation process may be provided with respect to the length direction and the width direction, thereby obtaining superior flexibility in adjusting the dopant profile of drain and source regions for non-planar transistors and/or for semiconductor devices in which the orientation of transistors may be selected to extend two orthogonal lateral directions. In still other cases, an appropriate masking regime may be applied if the adaptation of the dopant profile is to be restricted to a certain type of transistors.

With reference to FIGS. 2a-2j, further illustrative embodiments will now be described in more detail, wherein reference may also be made to FIGS. 1a-1f, if required.

Figure 2A:
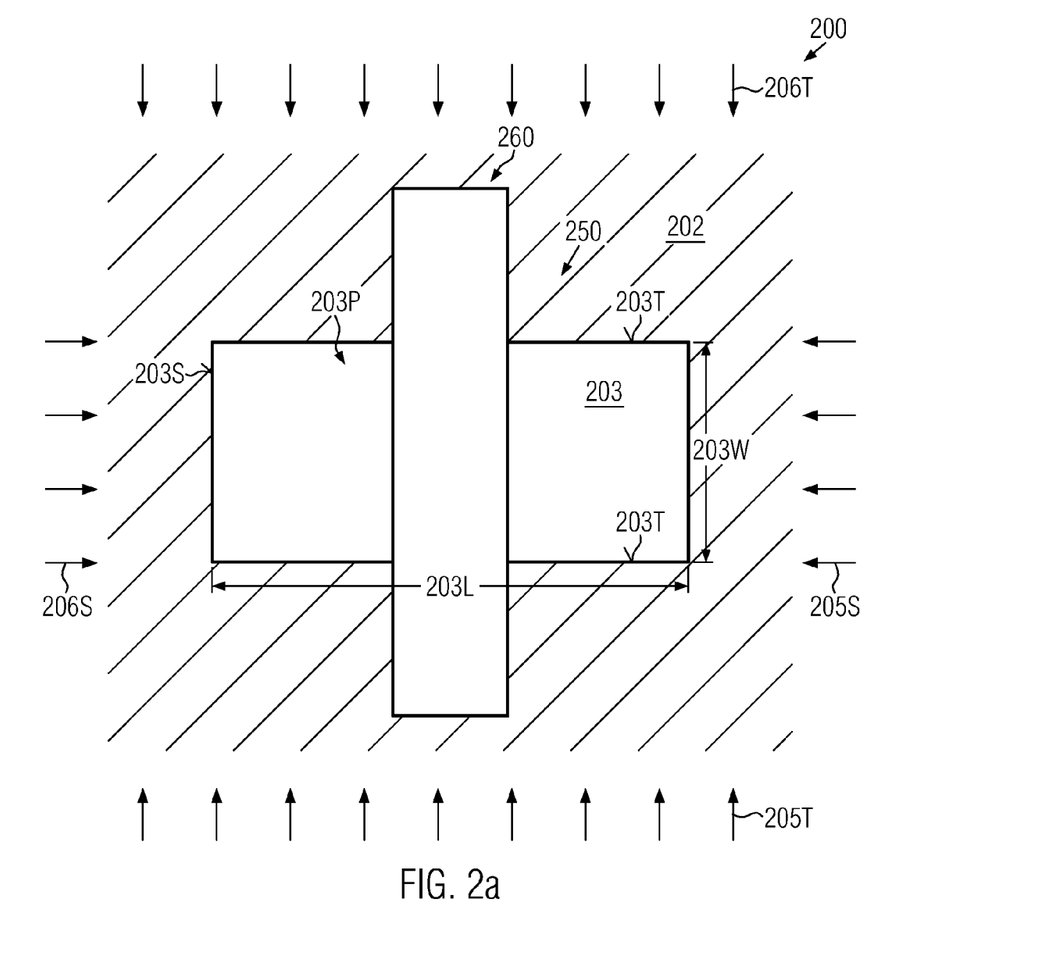
FIGS. 2a-2b schematically illustrate top views of a semiconductor device according to illustrative embodiments in which various implantation strategies are illustrated in order to incorporate a drain and source dopant species through exposed sidewall areas of an active region that extends above an isolation region.

FIG. 2a schematically illustrates a top view of a semiconductor device 200 comprising a semiconductor region or active region 203, in and above which a transistor 250 is formed. The semiconductor region or active region 203 may be comprised of a silicon-containing semiconductor material, which may enable the formation of a metal silicide in a later manufacturing stage. As shown, the active region 203 may have a width 203W, i.e., the lateral dimension along a width direction (see FIG. 1a), wherein it should be appreciated that the width 203W may vary along a length 203L of the active region 203 if a non-rectangular geometric configuration is to be considered. The size, shape and position of the active region 203 is determined by an isolation region 202, as is also discussed above with reference to the semiconductor device 100. Moreover, in the manufacturing stage shown, a gate electrode structure 260 is formed on the active region 203 and also extends into the isolation region 202, depending on the overall device configuration.

Generally, the transistor 250 may have any appropriate configuration, for instance the transistor 250 may have a configuration as shown in FIGS. 1b and 1c when referring to the transistor 150, for instance with respect to the configuration of the active region 203 and with respect to the gate electrode structure 260. In other cases, these components may have any other appropriate configuration, as required. Furthermore, in the manufacturing stage shown, the transistor 250 may receive a drain and source dopant species in order to implement an appropriate concentration profile which may provide superior process conditions at a peripheral area 203P upon forming appropriate contact areas, such as metal silicide regions, in a later manufacturing stage. As previously discussed with reference to the semiconductor device 100 as shown in FIG. 1f, the periphery 203P, for instance at sidewalls 203T defining the width 203W and possibly at sidewalls 203S, defining the length 203L, may be highly critical and may be exposed due to the recessed configuration of the isolation region 202. Thus, in some illustrative embodiments, at least a portion of the drain and source dopant species may be incorporated through the exposed sidewall surface areas 203T and/or 203S by applying implantation processes using an appropriate tilt angle. For example, as shown in FIG. 2a, in some illustrative embodiments, a first implantation step 205T may be applied in which an appropriate tilt angle is used in order to incorporate the drain and source dopant species through the sidewalls 203T and a second implantation step 206T may be applied so as to incorporate the dopant species through the oppositely positioned sidewall 203T. To this end, an appropriate tilt angle may be selected, which may be varied in a plane that is parallel to the width direction, i.e., in FIG. 2a, the vertical direction (see FIG. 1a). For example, for a substantially non-tilted implantation direction, which corresponds to a direction perpendicular to the drawing plane of FIG. 2a, a tilt of the implantation direction in a plane that is perpendicular to the drawing plane of FIG. 2a and that is aligned, i.e., parallel, to the width direction, may result in appropriate tilt angles for the implantation steps 205T, 206T, respectively. Similarly, in some illustrative embodiments, in addition to the implantation steps 205T, 206T, a third implantation step 205S and a fourth implantation step 206S may be applied so as to incorporate dopant species through the sidewalls 203S. Also in this case, appropriate tilt angles may be selected by varying the implantation axis in a plane that is perpendicular to the drawing plane of FIG. 2a and that is parallel to the length direction, i.e., in FIG. 2a, the horizontal direction.

Figure 2B:
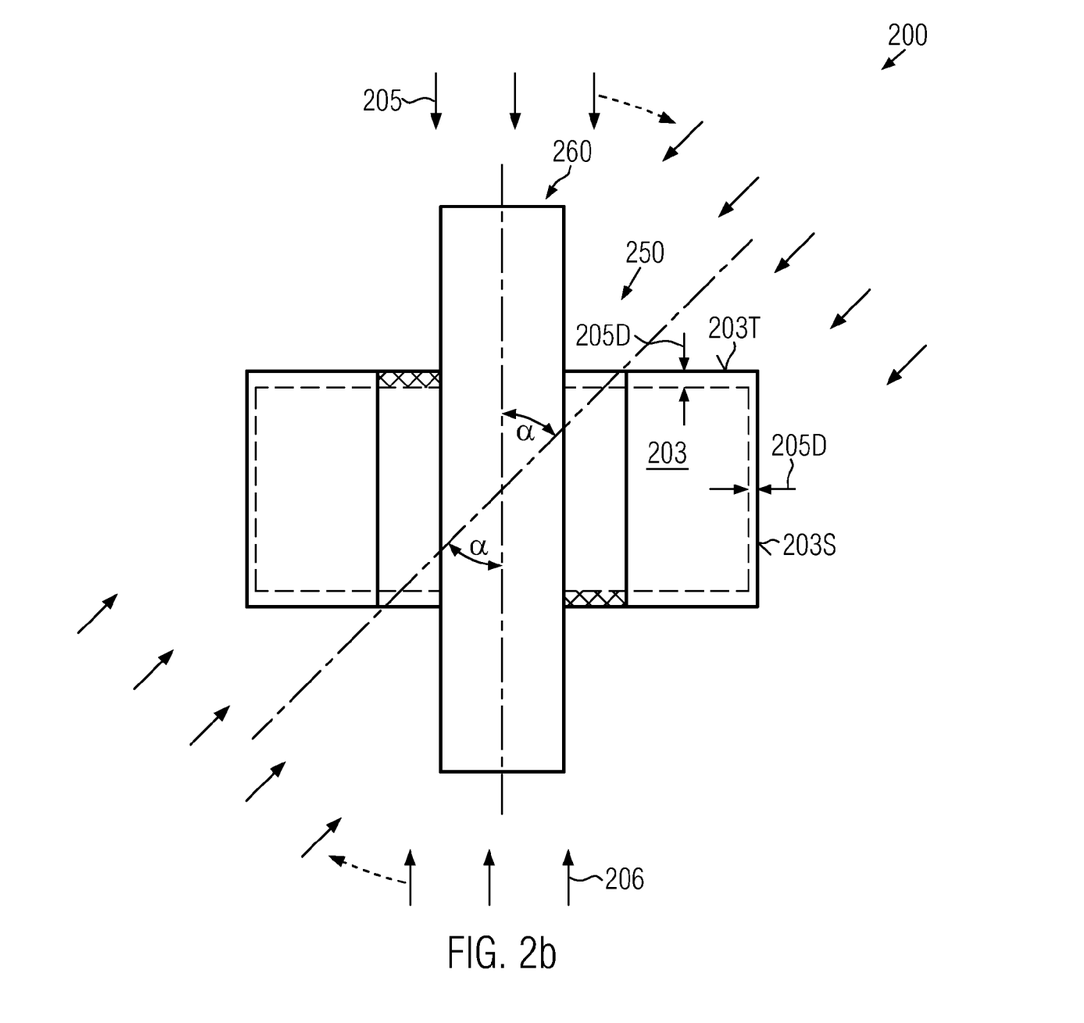

FIG. 2b schematically illustrates a top view of the device 200 according to further illustrative embodiments in which a first implantation process 205 may be applied in which an appropriate tilt angle may be selected, as, for instance, described above with reference to FIG. 2a, in order to allow the incorporation of a dopant species through substantially vertical sidewall surfaces, such as the surface areas 203S, 203T. Furthermore, an additional implantation angle may be superimposed, as indicated by the angle α, thereby enabling the incorporation of the dopant species concurrently into the active region 203 via the sidewalls 203T and 203S at a phase in which the angle α is unequal to zero. Consequently, by varying the angle α from zero to a specific value, for instance 45 degrees, for both implantation steps 205, 206, a variation of the penetration depth 205D around the perimeter of the active region 203 may be efficiently implemented.

Thus, by applying the process steps 205S, 206S in combination with the process steps 205T, 206T, as shown in FIG. 2a, a desired penetration depth of the drain and source dopants may be accomplished for any active regions, irrespective of the spatial orientation of the corresponding transistors. That is, even if transistors are provided with two different particular lateral orientations, the quadruple implantation sequence as shown in FIG. 2a may allow a reliable adaptation of the shallow drain and source dopant profile. Similarly, the process sequence 205, 206, each including at least the angles α equal to zero and at least one process step with α unequal to zero may also provide superior flexibility in obtaining the desired adapted dopant profile.

Figure 2C:
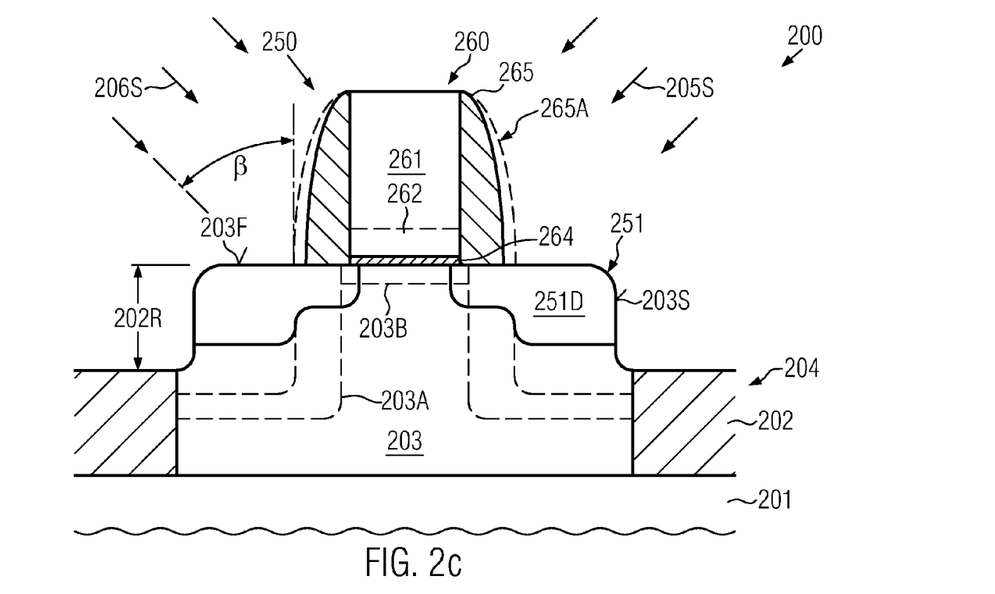
FIGS. 2c-2d schematically illustrate cross-sectional views of the semiconductor device in which tilted implantation processes are applied aligned to a length direction and a width direction, respectively, according to illustrative embodiments.

FIG. 2c schematically illustrates a cross-sectional view of the device 200 wherein the cross-section is taken along the length direction. As shown, the device 200 may comprise a substrate 201 in combination with a semiconductor layer 204, such as a silicon-containing semiconductor material, which is appropriately divided into a plurality of active regions by the isolation region 202. Moreover, as shown, the isolation region 202, at least in the vicinity of the active region 203, is recessed, as indicated by 202R, with respect to a top surface 203F of the active region 203. Moreover, in the manufacturing stage shown, the gate electrode structure 260 may be provided with any appropriate configuration, for instance comprising a gate dielectric material 264, which may also include a high-k dielectric material, as discussed above. Furthermore, an electrode material 261, possibly in combination with a metal-containing electrode material 262, may be provided when a sophisticated high-k metal gate electrode is to be implemented in the transistor 250. With respect to high-k metal gate electrode structures, the same criteria may apply as previously discussed with reference to the device 100. Moreover, a spacer structure 265 may be provided so as to act as an implantation mask, wherein, as indicated by 265A, an increased width may initially be applied, for instance in view of the tilted implantation processes 205S, 206S, if considered appropriate. Furthermore, the increased width of the spacer 265A may be reduced in a later manufacturing stage if considered appropriate.

Moreover, as also discussed above with reference to the device 100, a strain-inducing semiconductor alloy 203A may be provided in the active region 203, possibly in combination with a threshold voltage adjusting semiconductor alloy 203B.

The semiconductor device 200 as shown in FIG. 2c may be formed on the basis of any appropriate process strategy, for instance using processes as described with reference to the semiconductor device 100. Consequently, in the manufacturing stage shown, the drain and source regions 251 may be formed, or "deep" drain and source areas 251D thereof may be formed, on the basis of an ion implantation process. To this end, in some illustrative embodiments, a conventional non-tilted implantation process may be applied (not shown), while additionally the tilted implantation processes 205S, 206S may be used on the basis of through the exposed sidewall areas 203S, wherein, depending on the process parameters of the implantation steps 205S, 206S, the concentration profile of the deep drain and source areas 251D may more or less be efficiently adapted to the surface topography of the active region 203. For example, if the sidewall areas 203S comprise substantially vertically oriented sidewall portions, the angle β may be selected to be approximately 45 degrees with respect to the surface normal of the top surface 203F so that substantially equal amounts of dopant species may be incorporated through the top surface 203F and the sidewall surfaces 203S. Consequently, one or more appropriate values for the angle β may be selected in order to obtain a desired concentration profile.

Figure 2D:
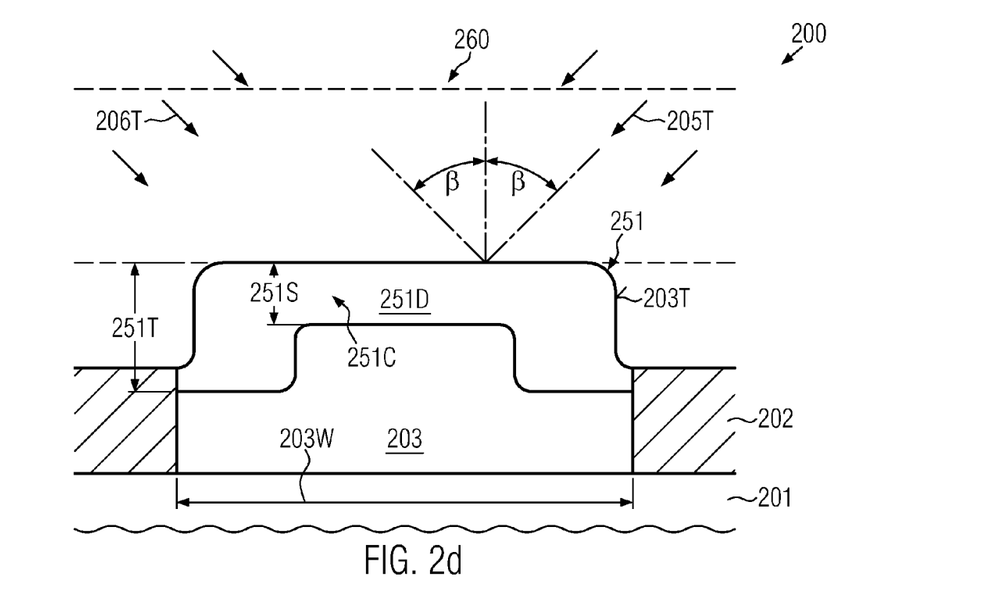

FIG. 2d schematically illustrates a cross-sectional view of the semiconductor device 200 taken along the width direction. Thus, corresponding to the situation as described with reference to FIG. 2a, the tilted implantation processes 206T, 205T may be applied so as to adapt the concentration profile of the deep drain and source regions 251D to the recessed configuration of the isolation region 202. Also, in this case, appropriate tilt angles β may be selected so as to obtain the desired adaptation of the profile 251D. As shown, at the periphery of the active region 203, the deep drain and source regions 251D may extend to a depth or height level 251T that is significantly below the depth 251S in a central area 251C of the deep drain and source regions 251D.

As discussed above, the tilted implantations 206T, 205T may be efficiently combined with the tilted implantations 205S, 206S as shown in FIGS. 2a and 2c. Moreover, if required, the implantation processes 205, 206, as illustrated in FIG. 2b, may be applied, which may correspond to the implantation steps 206T, 205T with an appropriate angle β when the angle α (FIG. 2b) is selected to be zero. When using the same angle β and varying the angle α, on the other hand, dopant species may be increasingly incorporated through the sidewalls 203S (FIG. 2b), thereby obtaining similar process conditions as are also described above with reference to FIG. 2c when referring to the implantation steps 205S, 206S.

In still other illustrative embodiments, the tilted implantation steps 206T, 205T may be applied without requiring any additional tilted implantation steps when a recessing of the isolation region 202 is substantially restricted to the sidewalls 203T, as will be explained with reference to FIG. 2e.

Figure 2E:
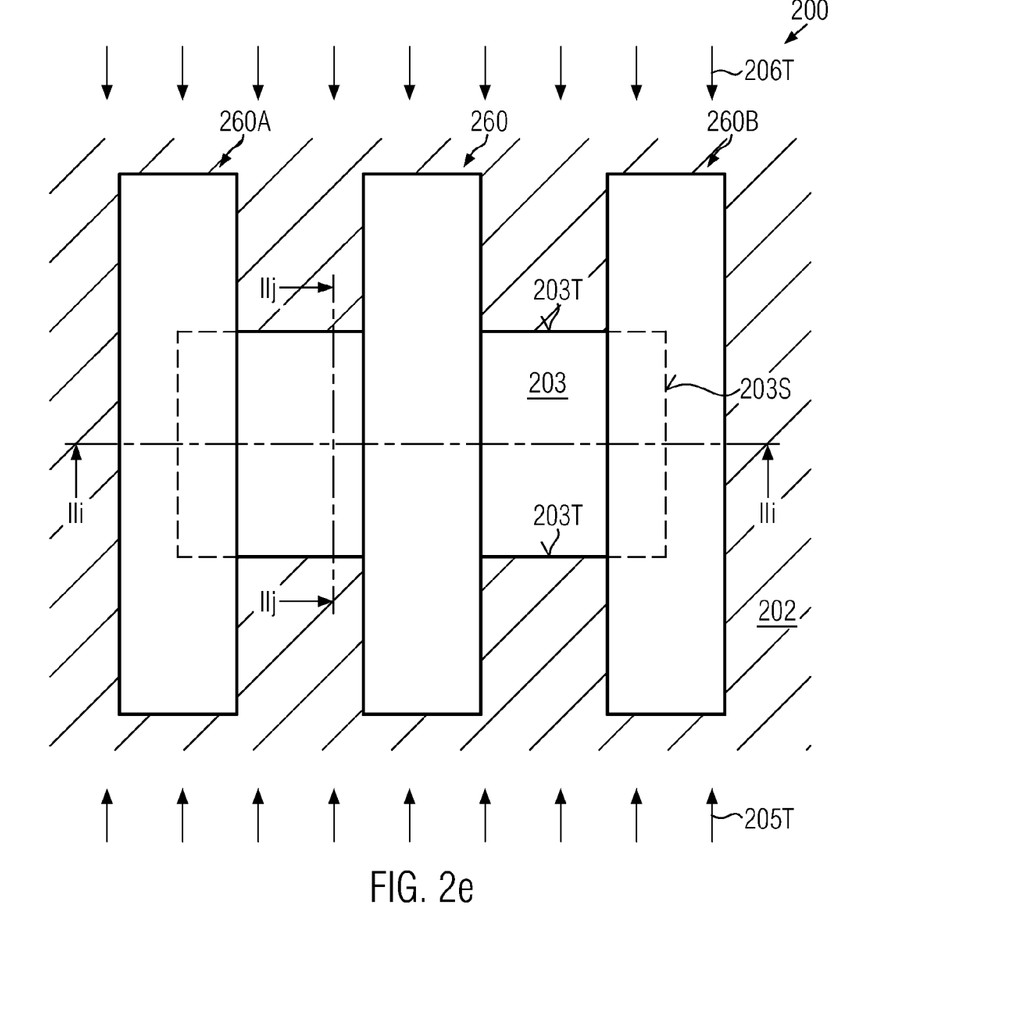
FIG. 2e schematically illustrates a top view of the semiconductor device according to illustrative embodiments in which a tilted implantation process may be applied so as to incorporate drain and source dopant species from sidewalls delimiting the width of the active region, while a sidewall area delimiting a length thereof may be covered by electrode structures, according to illustrative embodiments.

FIG. 2e schematically illustrates a top view of the semiconductor device 200 according to illustrative embodiments in which additional electrode structures 260A, 260B may be provided so as to be positioned above the active region 203 and the isolation region 202 such that the sidewalls 203S are positioned below the structures 260A, 260B. The electrode structures 260A, 260B may represent non-functional structures, which may be used for providing superior conditions for the complex patterning process, when forming the actual gate electrode structure 260. Consequently, in this manner, the electrically effective width of the active region 203 may be determined by the position of the electrode structures 260A, 260B. On the other hand, the sidewalls 203T may be exposed due to the complex manufacturing processes, as previously described. In this case, the tilted implantation steps 206T, 205T may be applied so as to incorporate the dopant species through the sidewall areas 203T, as described above, without requiring any additional tilted implantation processes, when any active region which requires an adapted drain and source dopant profile is oriented in the same manner as the active region 203. In other illustrative embodiments, differently oriented active regions 203 may be covered by a resist mask upon performing the tilted implantation steps 205T, 206T. Thereafter, appropriate tilted implantation steps may be performed for the previously masked active regions, while the active region 203 may be covered by a resist mask. In other cases, four tilted implantation steps may be applied, if considered appropriate, for differently oriented active regions, as is explained above.

Figure 2F:
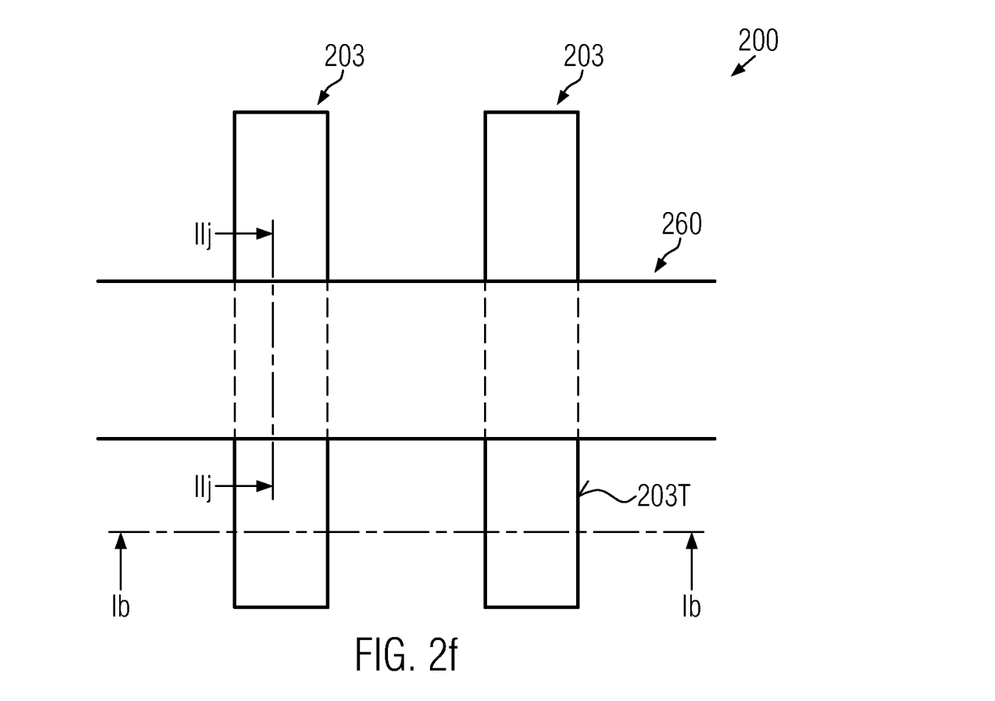
FIGS. 2f-2h schematically illustrate a top view and cross-sectional views, respectively, in which active regions of pronounced surface topography, for instance in the form of semiconductor fins, receive a shallow dopant profile on the basis of tilted implantation processes, according to further illustrative embodiments.

FIG. 2f schematically illustrates the semiconductor device 200 according to further illustrative embodiments in which the active region 203 may be provided in the form of a semiconductor fin, which may per se have a very pronounced surface topography. For example, a plurality of semiconductor fins or active regions 203 may be provided in combination with an appropriate gate electrode structure 260. Consequently, the semiconductor fins 203 may have the sidewalls 203T, which may correspond to substantially vertical sidewall surface areas.

Figure 2G:
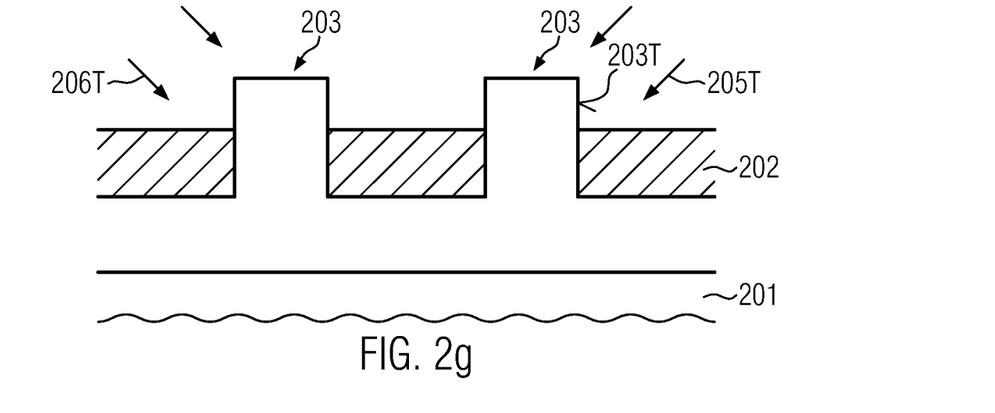

FIG. 2g schematically illustrates a cross-sectional view of the device 200 of FIG. 2f along the line Ib. As shown, the recessed isolation region 202 may extend to a certain height of the semiconductor fins 203 according to requirements, for instance, for defining the electrically effective height of the fins 203 and the like. In this case, the tilted implantation steps 205T, 206T may be applied so as to obtain a shallow dopant profile, wherein the resulting drain and source regions may be appropriately adapted to the surface topography of the exposed portions of the semiconductor fins 203, which may provide superior process conditions in a later manufacturing stage upon forming a metal silicide in the semiconductor fins 203.

Figure 2H:
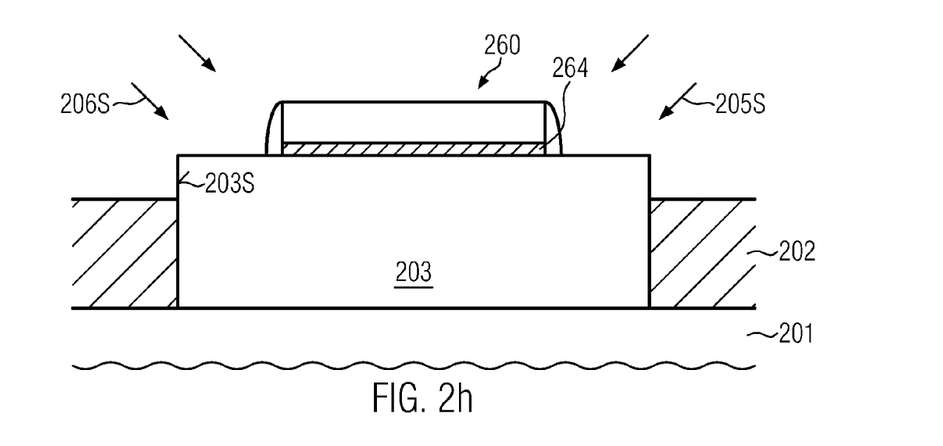

FIG. 2h schematically illustrates the device 200 according to the section as indicated by IIj in FIG. 2f. As shown, the gate electrode structure 260 may be formed above a central portion of the semiconductor fin 203, which may be formed on exposed sidewall surface areas, i.e., at the surface areas 203S, in order to form a multiple channel or FinFET configuration. Furthermore, if required, the tilted implantation processes 206S, 205S may be applied with appropriate tilt angles so as to incorporate the drain and source regions also through the sidewalls 203S, thereby obtaining the desired adapted dopant profile.

It should be appreciated that the active regions 203 in the form of semiconductor fins may be formed on the basis of any appropriate process techniques, for instance forming respective fins from a semiconductor layer of an SOI (silicon-on-insulator) device, while in other cases, as for instance shown in FIG. 2g, the semiconductor fins 203 may be formed from a bulk configuration of the substrate, while the electrically effective height may then be defined on the basis of the isolation region 202.

Figure 2I:
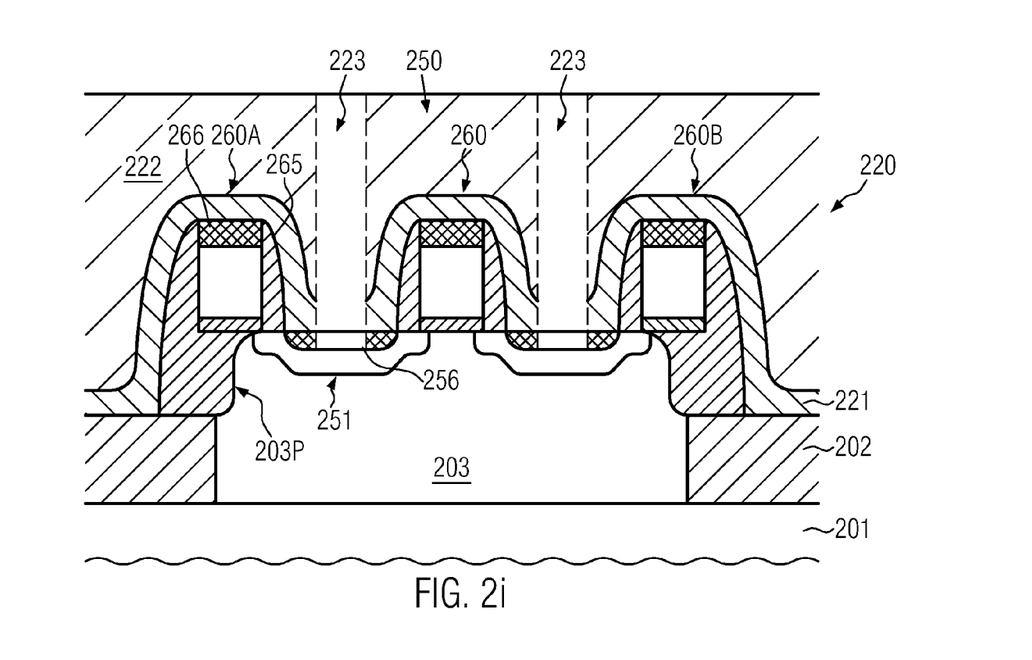
FIGS. 2i-2j schematically illustrate cross-sectional views of the semiconductor device in further advanced manufacturing stages in which an interlayer dielectric material of a contact level may be patterned so as to obtain contact openings, according to still further illustrative embodiments.

FIG. 2i schematically illustrates a cross-sectional view of the semiconductor device 200 in a further advanced manufacturing stage. In the embodiment shown in FIG. 2i, the cross-section may be taken along the line Hi, as shown in FIG. 2e. As shown, a contact level 220 may be provided and may comprise, in the manufacturing stage shown, a first dielectric material 221, which may also be referred to as an etch stop material, in combination with a second dielectric material 222, which may also be referred to as an interlayer dielectric material. For example, the materials 221, 222 may be provided in the form of silicon nitride and silicon dioxide and the like. Furthermore, in some illustrative embodiments, metal silicide 256 may be formed within the drain and source regions 251, wherein the lateral extension of the metal silicide 256 may be substantially defined by the sidewall spacer structure 265. As shown, the metal silicide 256 may be positioned within the drain and source regions 251 by appropriately adapting the process parameters of the silicidation process, wherein, in the embodiment shown, undue formation of metal silicide at the periphery 203P may be efficiently suppressed due to the presence of the electrode structures 260A, 260B. In other cases, when a device configuration is considered as shown in FIG. 2c, the formation of the metal silicide 256 may also be restricted to within the drain and source regions 251 due to the appropriate lateral adaptation of the dopant concentration profile as shown for the deep regions 251D in FIG. 2c.

Moreover, metal silicide regions 266 may be provided in the gate electrode structures 260, 260A, 260B in some illustrative embodiments, while in other cases the material 266 may not be formed in this manufacturing stage.

Figure 2J:
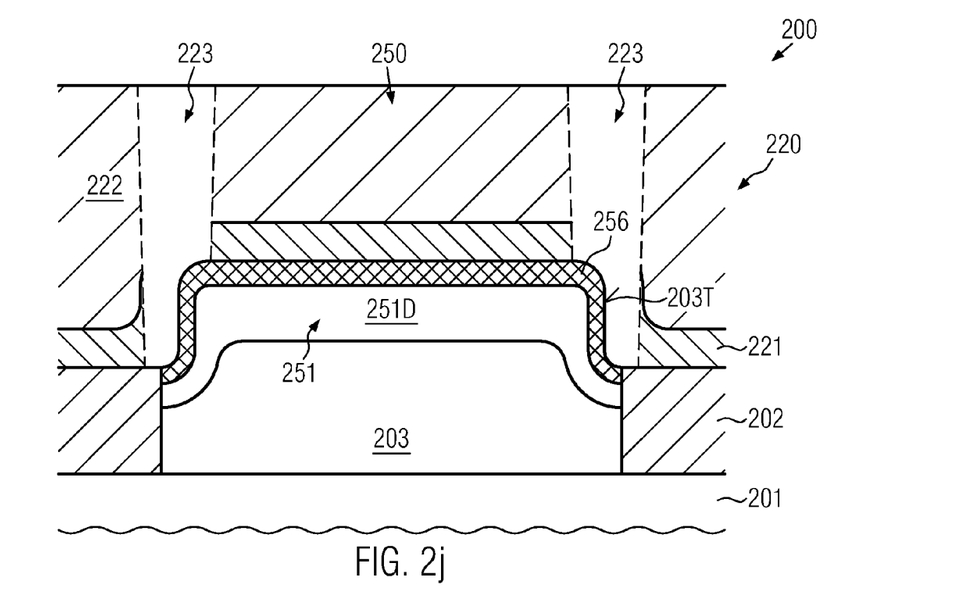

FIG. 2j schematically illustrates a cross-sectional view of the device 200 along the line IIj as shown in FIG. 2e, or along a section in the width direction of the semiconductor device as shown in FIG. 2c. As illustrated, in some illustrative embodiments, the metal silicide 256 may be formed in the drain and source region 251, as discussed above, while in other cases the metal silicide 256 may be formed in a later manufacturing stage. Furthermore, the contact level comprising the materials 221 and 222 may be formed above the active region 203 and the isolation structure 202.

The semiconductor device 200 as shown in FIGS. 2i and 2j may be formed on the basis of the following processes. After performing any high temperature processes, such as sophisticated anneal processes with reduced dopant diffusion, as discussed above, in some illustrative embodiments, the metal silicide materials 256, 266 may be formed by any appropriate silicidation technique, wherein the metal silicide 256 may be reliably positioned within the drain and source regions 251 due to the adapted concentration profile of the deep drain and source regions 251D in the vicinity of the sidewalls 203T (FIG. 2j) and/or due to the adapted concentration profile in the vicinity of the sidewalls 203S (FIG. 2c). Thereafter, the materials 221, 222 may be deposited on the basis of well-established deposition techniques, followed by a planarization process and a subsequent sophisticated patterning process for forming contact openings 223 in the materials 222, 221, which may be subsequently filled with an appropriate contact material so as to connect to the metal silicide material 256 in the drain and source regions 251.

In other illustrative embodiments, the contact openings 223 may be used as a mask for forming the metal silicide 256 in a locally restricted manner through the openings 223, wherein the superior profile of the drain and source regions 251D, in particular at the sidewall areas 203T, may provide superior process robustness, for instance with respect to slight misalignments of the openings 223 since the concentration profile of the region 251D at the surface 203T has sufficient depth or thickness in order to reliably position the material 256 within the drain and source regions 251D upon performing a silicidation process through the openings 223.

As a result, the present disclosure provides manufacturing techniques and semiconductor devices in which an appropriate adaptation of the contour of drain and source regions may be accomplished for active regions having a pronounced surface topography, for instance due to a recessing of isolation regions, or caused by providing semiconductor fins by incorporating drain and source dopant species through exposed sidewall surface areas using appropriately selected tilt angles.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode structure above a substantially planar upper surface of an active region of a silicon-containing semiconductor substrate, wherein said active region is enclosed by an isolation region positioned in said substrate and wherein an upper surface of said isolation region is recessed relative to said substantially planar upper surface of said active region such that perimeter sidewalls of said active region are exposed;
   performing an implantation process on said active region with said gate electrode structure positioned above said active region so as to introduce drain and source dopant species (a) through said upper surface of the active region, and (b) through at least a portion of the exposed perimeter sidewalls of said active region; and selectively forming a metal silicide on exposed portions of said silicon-containing active region.

2. The method of claim 1, wherein performing said implantation process comprises performing a first implantation step with a first tilt angle and performing a second implantation step with a second tilt angle, wherein said first tilt angle results in dopant penetration through at least a first perimeter sidewall of said active region in a width direction and said second tilt angle results in dopant penetration through at least a second perimeter sidewall that is opposite to said first sidewall.

3. The method of claim 2, wherein performing said implantation process comprises performing a third implantation step with a third tilt angle and performing a fourth implantation step with a fourth tilt angle, wherein said third tilt angle results in dopant penetration through at least a third perimeter sidewall delineating said active region in a length direction and said fourth tilt angle results in dopant penetration through at least a fourth perimeter sidewall that is opposite to said third sidewall.

4. The method of claim 1 wherein performing said implantation process comprises performing at least two implantation steps with a tilt angle in the range of approximately 30-60 degrees with respect to a surface normal of said active region.

5. The method of claim 1, further comprising forming a spacer structure on sidewalls of said gate electrode structure prior to performing said implantation process and using at least a portion of said spacer structure as a mask for forming said metal silicide.

6. The method of claim 1, further comprising forming a semiconductor material in at least a portion of said active region by an epitaxial growth process prior to performing said implantation process.

7. The method of claim 6, wherein forming said semiconductor material comprises forming a strain-inducing semiconductor alloy in said active region.

8. The method of claim 6, wherein forming said semiconductor material comprises forming a threshold voltage adjusting semiconductor alloy on said active region.

9. The method of claim 1, further comprising forming said active region by forming a semiconductor fin from a silicon-containing semiconductor layer.

10. The method of claim 1, further comprising forming an interlayer dielectric material above said active region and said gate electrode structure after forming said metal silicide.

11. A method, comprising:
forming a gate electrode structure above a substantially planar upper surface of an active region of a silicon-containing semiconductor substrate, wherein said active region is enclosed by an isolation region positioned in said substrate and wherein an upper surface of said isolation region is recessed relative to said substantially planar upper surface of said active region such that perimeter sidewalls of said active region are exposed, said active region having a length and a width and being laterally delineated with respect to at least one of said length and said width by an isolation region that is recessed with respect to said active region such that perimeter sidewall areas of said active region are exposed along said length and said width;
forming drain and source regions in said active region by performing at least one tilted implantation step so as to introduce a portion of drain and source dopants through at least a portion of said exposed sidewall area; and
forming a metal silicide on a portion of said active region.

12. The method of claim 11, wherein performing said at least one tilted implantation step comprises using at least one tilt angle selected so as to introduce a portion of said drain and source dopants through one or more first perimeter sidewall defining said length.

13. The method of claim 12, wherein performing said at least one tilted implantation step further comprises using said at least one tilt angle so as to introduce a portion of said drain and source dopants through one or more second perimeter sidewall defining said width.

14. The method of claim 11, wherein forming said gate electrode structure comprises forming a spacer structure prior to performing said at least one tilted implantation process and using at least a portion of said spacer structure as a mask when forming said metal silicide.

15. The method of claim 11, further comprising forming an interlayer dielectric material above said active region and said gate electrode structure and forming a contact opening in said interlayer dielectric material, wherein said metal silicide is formed through said contact opening.

16. The method of claim 11, further comprising forming a semiconductor alloy in at least a portion of said active region prior to performing said at least one tilted implantation process.

17. The method of claim 11, further comprising forming a semiconductor fin from a semiconductor layer and using said semiconductor fin as said active region.

18. A method, comprising:
forming a gate electrode structure above a substantially planar upper surface of an active region of a silicon-containing semiconductor substrate, wherein said active region is enclosed by an isolation region positioned in said substrate and wherein an upper surface of said isolation region is recessed relative to said substantially planar upper surface of said active region such that perimeter sidewalls of said active region are exposed;
performing an implantation process on said active region with said gate electrode structure positioned above said active region so as to introduce drain and source dopant species (a) through said upper surface of the active region, and (b) through at least a portion of the perimeter sidewalls; and
selectively forming a metal silicide on exposed portions of said silicon-containing active region including at least a portion of said perimeter sidewalls.

19. The method of claim 18, wherein performing said implantation process comprises:
performing a first implantation step with a first tilt angle and performing a second implantation step with a second tilt angle, wherein said first tilt angle results in dopant penetration through at least a first perimeter sidewall delineating said active region in a width direction and said second tilt angle results in dopant penetration through at least a second perimeter sidewall that is opposite to said first sidewall; and,
performing a third implantation step with a third tilt angle and performing a fourth implantation step with a fourth tilt angle, wherein said third tilt angle results in dopant penetration through at least a third perimeter sidewall delineating said active region in a length direction and said fourth tilt angle results in dopant penetration through at least a fourth perimeter sidewall that is opposite to said third sidewall.

20. The method of claim 18, further comprising forming a spacer structure on sidewalls of said gate electrode structure prior to performing said implantation process and using at least a portion of said spacer structure as a mask for forming said metal silicide.

* * * * *